United States Patent [19]

Teherani et al.

[11] Patent Number: 5,188,988
[45] Date of Patent: Feb. 23, 1993

[54] PASSIVATION OXIDE CONVERSION WHEREIN AN ANODICALLY GROWN OXIDE IS CONVERTED TO THE SULFIDE

[75] Inventors: Towfik H. Teherani, Plano; D. Dawn Little, Euless, both of Tex.

[73] Assignee: Texas Instruments Incorporated, Dallas, Tex.

[21] Appl. No.: 618,150

[22] Filed: Nov. 26, 1990

Related U.S. Application Data

[62] Division of Ser. No. 225,597, Jul. 27, 1988.

[51] Int. Cl.⁵ ............... H01L 21/00; H01L 21/02; H01L 21/76; H01L 21/473
[52] U.S. Cl. ............................... 437/235; 437/225; 437/228; 437/237; 437/243; 437/244; 205/157
[58] Field of Search ............ 437/225, 228, 235, 237, 437/243, 244; 204/34.5, 56.1; 148/33.3

[56] References Cited

U.S. PATENT DOCUMENTS

| | | | |
|---|---|---|---|
| 3,977,018 | 8/1976 | Catagnus et al. | 204/15 |
| 4,632,886 | 12/1986 | Teherani et al. | 204/34.5 |
| 4,818,327 | 4/1989 | Davis et al. | 204/298.09 |
| 4,961,829 | 10/1990 | Mainzer et al. | 204/34.5 |

FOREIGN PATENT DOCUMENTS 0145157 8/1983 Japan.
0126276 5/1988 Japan.

OTHER PUBLICATIONS

Nemirovsky, Y.; Interface of p-type $Hg_{1-x}Cd_xTe$ passivated with native sulfides, J. Appl. Phys. 58(1), Jul. 1985, pp. 366-373.
Ghandhi, S., VLSI Fabrication Principles, Wiley & Sons, 1983, pp. 372-373.

Primary Examiner—Brian E. Hearn
Assistant Examiner—B. Everhart
Attorney, Agent, or Firm—Richard A. Stoltz; Richard L. Donaldson; Jay Cantor

[57] ABSTRACT

A method of passivation of $Hg_{1-x}Cd_xTe$ and similar semiconductors by surface oxidation (such as anodic) followed by chemical conversion of the oxide to either sulfide or selenide or a combination of both is disclosed. Preferred embodiments provide sulfide conversion by immersion of the oxide coated $Hg_{1-x}Cd_xTe$ in a sodium sulfide solution in water with optional ethylene glycol and the selenidization by immersion in a solution of sodium selenide plus sodium hydroxide in water and ethylene glycol. Also, infrared detectors incorporating such sulfide and selenide passivated $Hg_{1-x}Cd_xTe$ are disclosed.

11 Claims, 4 Drawing Sheets

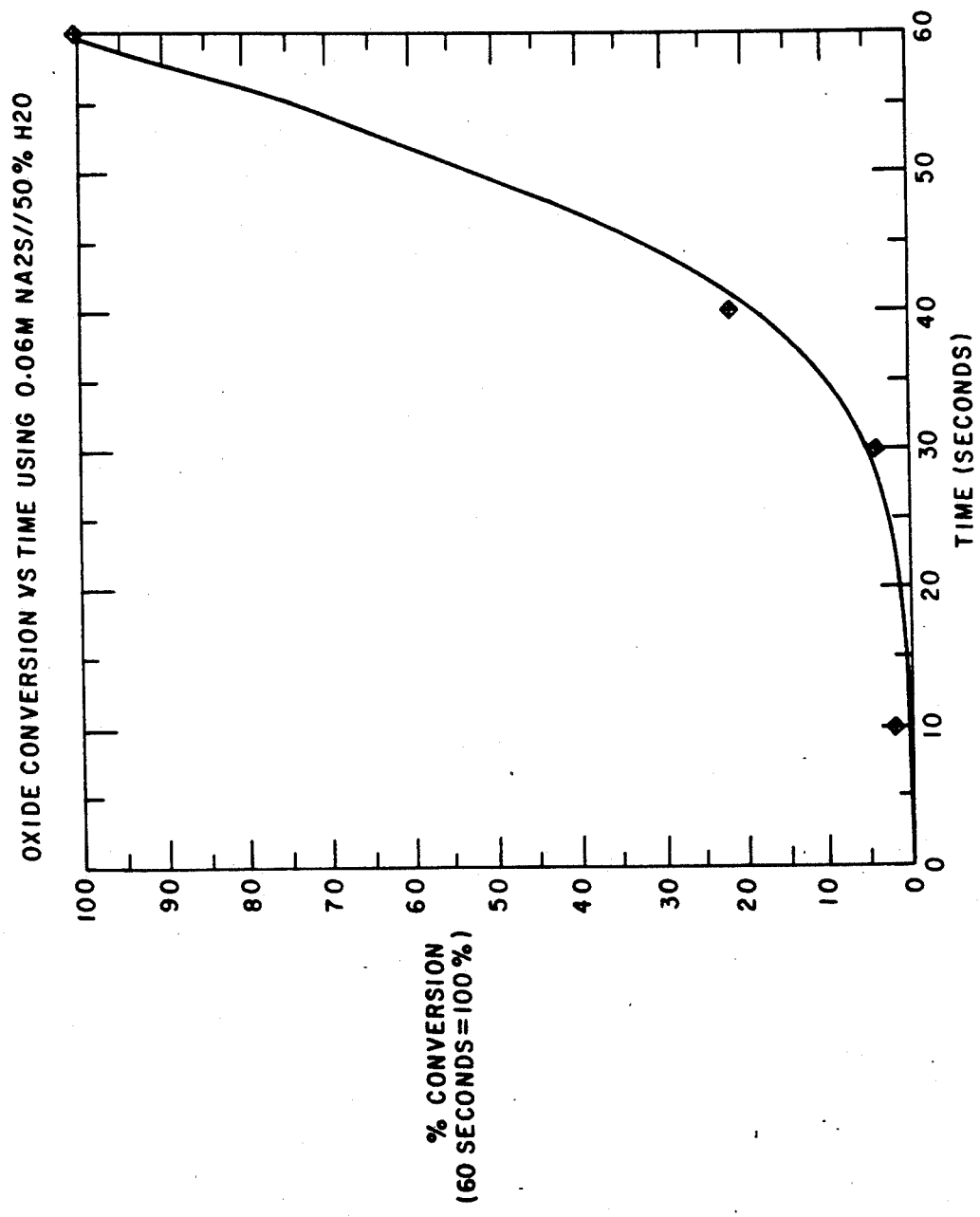

PASSIVATION OXIDE CONVERSION WHEREIN AN ANODICALLY GROWN OXIDE IS CONVERTED TO THE SULFIDE

This is a continuation, division, of application Ser. No. 225,597, filed Jul. 27, 1988 which was a continuation of application Ser. No. 824,897, filed Jan. 31, 1986, now abandoned.

BACKGROUND OF THE INVENTION

The present invention relates to semiconductor materials, and, more particularly, to the passivation of mercury cadmium telluride ($Hg_{1-x}Cd_xTe$) and related materials by chemical conversion of a grown surface oxide to a sulfide or a selenide.

Alloys of mercury telluride and cadmium telluride, generically denoted $Hg_{1-x}Cd_xTe$, are extensively employed as photosensitive semiconductors for infrared radiation detection. For example, $Hg_8Cd_2Te$ has a bandgap of about 0.1 eV which corresponds to a photon wavelength of 12 $\mu m$ and $Hg_{73}Cd_{27}Te$ has a bandgap of about 0.24 eV which corresponds to a photon wavelength of 5 $\mu m$; these two wavelengths are in the two atmospheric windows of greatest interest for infrared detectors. In particular, p-n junction $Hg_{1-x}Cd_xTe$ photodiode arrays have long been used (see, for example, Lorenze, U.S. Pat. No. 4,286,278) and extrinsic p type $Hg_{1-x}Cd_xTe$ has potential application in infrared focal plane MIS detector arrays operating in the 10-12 $\mu m$ wavelength window. (Note that intrinsic p type $Hg_{1-x}Cd_xTe$, whose doping is presumably dominated by mercury vacancies, was recently found to have midgap recombination centers proportional in concentration to the shallow acceptors; see C. Jones et al, 3 J. Vac. Sci. Tech. A 131 (1985). These recombination centers shorten minority carrier lifetimes and are sources of recombination-generation noise; and thus extrinsic p type $Hg_{1-x}Cd_xTe$ is preferred to intrinsic p type.) Such detectors are fabricated in large area $Hg_{1-x}Cd_xTe$ which may be grown by LPE, MOCVD, MBE or bulk techniques and are operated typically at liquid nitrogen temperatures to limit background noise.

Passivation of $Hg_{1-x}Cd_xTe$ prior to detector fabrication is necessary to avoid surface contamination by residues of various processing steps; such contamination affects the electrical characteristics of the detectors, for example, the photocarrier lifetime and stability. Analogous passivation of silicon for integrated circuits fabrication is typically achieved by growth of thermal oxides at temperatures about 1,000° C.; however, thermal growth of oxides on $Hg_{1-x}Cd_xTe$ is not feasible due to the out diffusion of mercury at even moderate temperatures. Consequently, passivation of $Hg_{1-x}Cd_xTe$ by deposition of zinc sulfide or silicon dioxide has been used, but such passivation yields detectors that degrade (surface state density and accumulated surface charge vary and give unstable device characteristics) when subjected to temperatures over 70° C. An improvement is passivation by anodic oxide: oxides of mercury, cadmium, and tellurium are grown on the surface of $Hg_{1-x}Cd_xTe$ electrochemically in a KOH solution; see Catagnus, U.S. Pat. No. 3,977,018. Anodic oxide is also temperature sensitive and yields detectors that degrade at about 80° C. Further, even extended storage at room temperature degrades such detectors. Thus it is a problem to provide a passivation for $Hg_{1-x}Cd_xTe$ that avoids detector degradation at temperatures somewhat above room temperature.

SUMMARY OF THE INVENTION

The present invention provides passivation methods and passivation layers for $Hg_{1-x}Cd_xTe$ by oxidation of the surface of $Hg_{1-x}Cd_xTe$ followed by immersion in a sulfide or selenide solution to convert the oxide to a sulfide or selenide. The resultant passivation layer is primarily cadmium sulfide with some mercury sulfide, or cadmium selenide with some mercury selenide, and leads to infrared detectors that resist degradation at temperatures of 100° C. Such passivation layers are compatible with standard $Hg_{1-x}Cd_xTe$ processing and solve the problems of known passivation layers.

BRIEF DESCRIPTION OF THE DRAWINGS

FIG. 4 illustrates an oxide conversion rate.

DESCRIPTION OF THE PREFERRED EMBODIMENTS

Figure 1A:
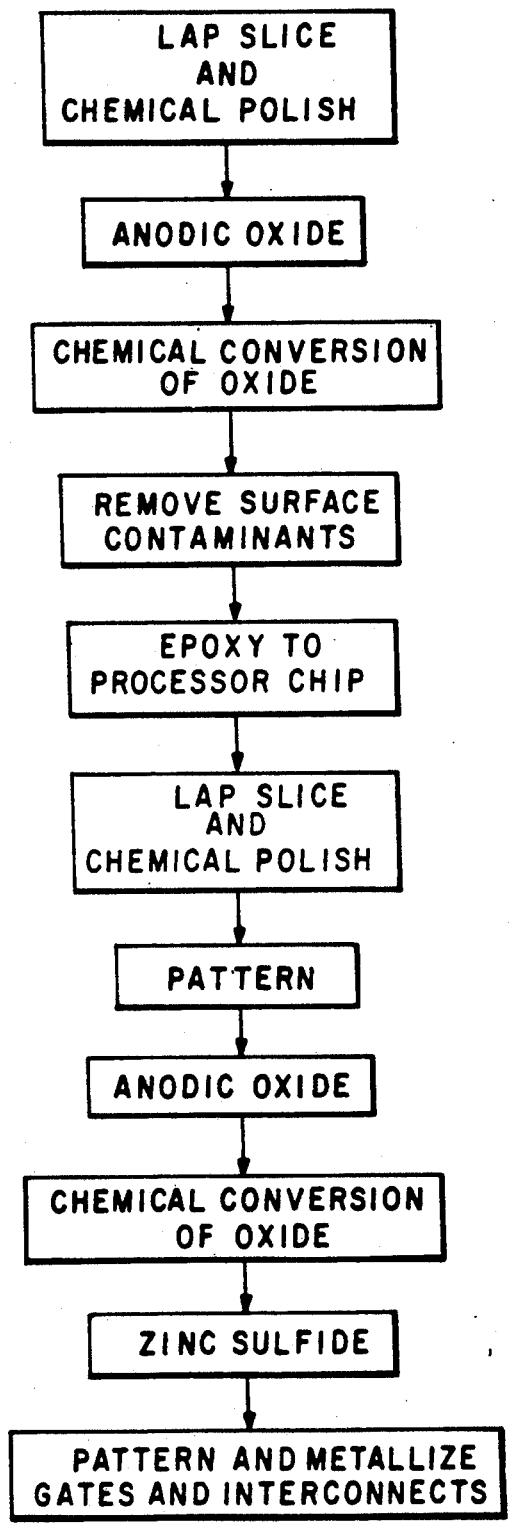
FIGS. 1A-B are a flow chart of a fabrication process for an array of $Hg_{1-x}Cd_xTe$ photodetectors (an infrared imager) and a partial cross sectional view of a single photodetector in such an array.
Figure 1B:
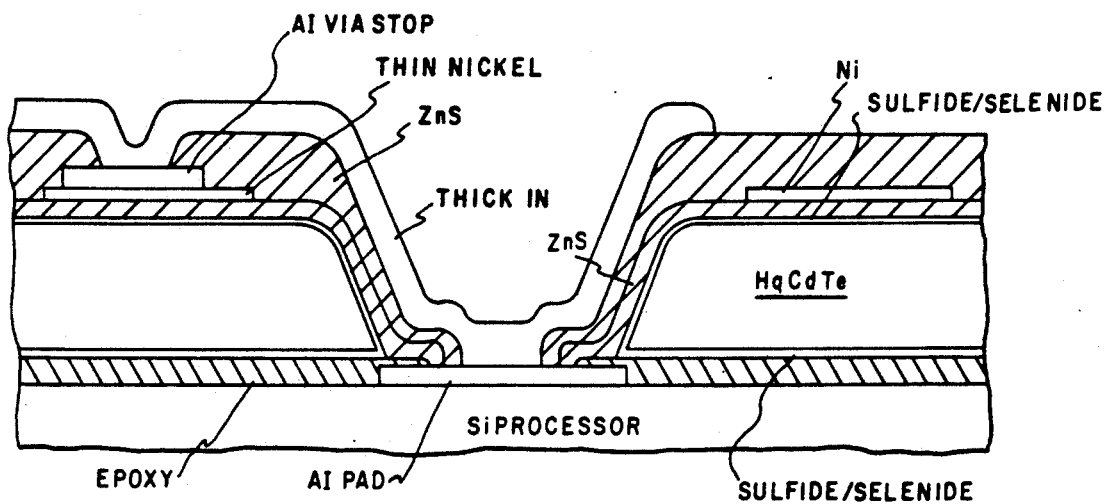

FIG. 1A is a flow chart incorporating preferred embodiment oxide conversions in the fabrication of a hybrid array of $Hg_{1-x}Cd_xTe$ MIS photodetectors, and FIG. 1B illustrates a single detector of such an array in partial cross sectional view. The fabrication includes the following steps. First, a single crystal n type $Hg_{1-x}Cd_xTe$ slice (typically 20 mm by 5 mm by 0.5 mm) is waxed to a lapping plug on one if its 20 mm by 5 mm surfaces and is lapped (with for example, a paste of five micron alumina particles followed by three micron particles) to remove any damage to the other 20 mm by 5 mm surface resulting from the sawing of an ingot of $Hg_{1-x}Cd_xTe$ into slices. Next, the lapped surface of the slice is chemically polished with a 0.5% solution of bromine in methanol to remove any damage arising from the mechanical lapping. After cleaning, the polished surface is anodically oxidized to a thickness of about 600Å, and any surface contaminants are removed. Then the oxide is converted to a sulfide (first preferred embodiment) or a selenide (second preferred embodiment) passivating layer about 200Å thick. Next, the $Hg_{1-x}Cd_xTe$ slice is epoxied to a silicon processor chip with the passivated surface making the contact (the lower layer of sulfide or selenide in FIG. 1B). The silicon chip is now waxed to a lapping plug and the exposed 20 mm by 5 mm surface of the $Hg_{1-x}Cd_xTe$ slice is lapped down until the $Hg_{1-x}Cd_xTe$ slice is about 75 microns thick; this is followed by chemical polishing down to a slice thickness of about 12 microns. Now the exposed $Hg_{1-x}Cd_xTe$ is patterned and etched with bromine-methanol to form an array of $Hg_{1-x}Cd_xTe$ detectors areas; further processing (such as ion milling) opens vias for each of the detector areas to connect with an adjacent aluminum contact pad on the silicon processor chip. Next, the $Hg_{1-x}Cd_xTe$ is again anodically oxidized (600Å) and the oxide again converted to a sulfide or selenide with a thickness of 200Å. This passivation is followed by deposition of 2,500Å of zinc sulfide; the two layer insulator (sulfide or selenide plus zinc sulfide)

forms the MIS gate insulator. Patterning and etching to define the gates comes next, and is followed by gate metallization, further zinc sulfide, and interconnections to complete the array of detectors (which is also called a charge imaging matrix). See, generally, for the anodic oxide version of the process, Schulte, U.S. Pat. No. 4,447,291, which is hereby incorporated by reference as are all other references cited.

Other types of infrared detectors and arrays of detectors incorporate $Hg_{1-x}Cd_xTe$ with passivation layers of various kinds, and these detectors and arrays may similarly be fabricated with substitution of their passivation steps by oxide formation (anodically grown, native oxide, plasma grown, or other) and subsequent chemical conversion to sulfide or selenide.

Figure 2:
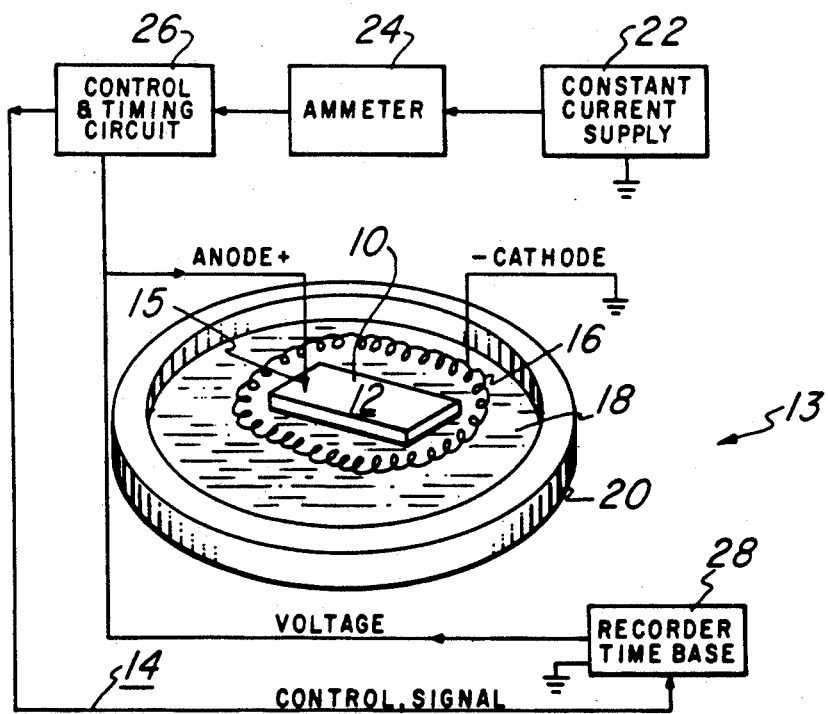
FIG. 2 is a schematic block diagram for an anodization apparatus.

FIG. 2 schematically illustrates anodizing apparatus 13 which may be used for the anodic oxidation steps of the flow of FIG. 1A, and employs a two electrode Teflon cell. $Hg_{1-x}Cd_xTe$ slice 10 is placed horizontally in the cell with cleaned surface 12 of slice 10 made the anode via contact with an etched tungsten or titanium probe 15 (the edges of slice 10 are only a small portion of the area in contact with the electrolyte). The cathode is circular platinum electrode 16. Electrolyte 18 may be one of several solutions: for example. 0.1M KOH in 10% water and 90% ethylene glycol. The effect of the electrolyte on the anodic oxide layer characteristics will be discussed in the following. Electrolyte 18 is contained in a suitable tank 20 which may be Teflon or polypropylene.

Apparatus 13 has a constant current supply source 22 for supplying a constant current of about 350 µA (current density of about 350 µA/cm² for a 20 mm by 5 mm slice) through an ammeter 24 to a control and timing circuit 26. Timing and control circuit 26 has one output connected to the anode and another output connected to a recorder 28 which records the voltage and anodization formation time. Timing and control circuit 26 automatically adjusts the voltage of the system to maintain the current constant during anodization of surface 12. Electrolyte 18 is not stirred during the anodization and is at about room temperature.

A constant current applied for a definite time grows an anodic oxide layer on $Hg_{1-x}Cd_xTe$ having reproducible uniform properties; the electrolyte selected determines the thickness and quality of the anodized layer. $Hg_{.8}Cd_{.2}Te$ anodized with 0.1M KOH in 10% water and 90% ethylene glycol at a current density of 350 µA/cm² for fifteen minutes yields a 600 Å thick oxide layer which has an approximate composition of $Hg_{.5}Cd_{.2}TeO_{2.7}$ (that is, a fractional compositional of approximately 50% $HgTeO_3$, 20% $CdTeO_3$, and 30% $TeO_2$). The applied voltage to maintain the constant current increases with increasing layer thickness due to the increasing impedance of the layer.

After the anodic oxide is grown on $Hg_{1-x}Cd_xTe$ slice 10, the first preferred embodiment method proceeds as follows: slice 10 is dipped and swished in a solution of 0.5M $Na_2S$ in 50% water and 50% ethylene glycol at room temperature for 60 seconds; this results in the conversion of the oxide layer to a sulfide layer about one third the thickness of the oxide. Note that for sulfide concentrations below 0.5M, an increase in sulfide concentration increases the conversion rate; and addition of organic solvents such as ethylene glycol to the aqueous sulfide solution has a dramatic effect on the conversion rate. See FIG. 4 for illustration of the conversion rate for a solution of 0.06M $Na_2S$ in 50% water and 50% ethylene glycol; note the nonlinear time character of the conversion rate.

Figure 3:
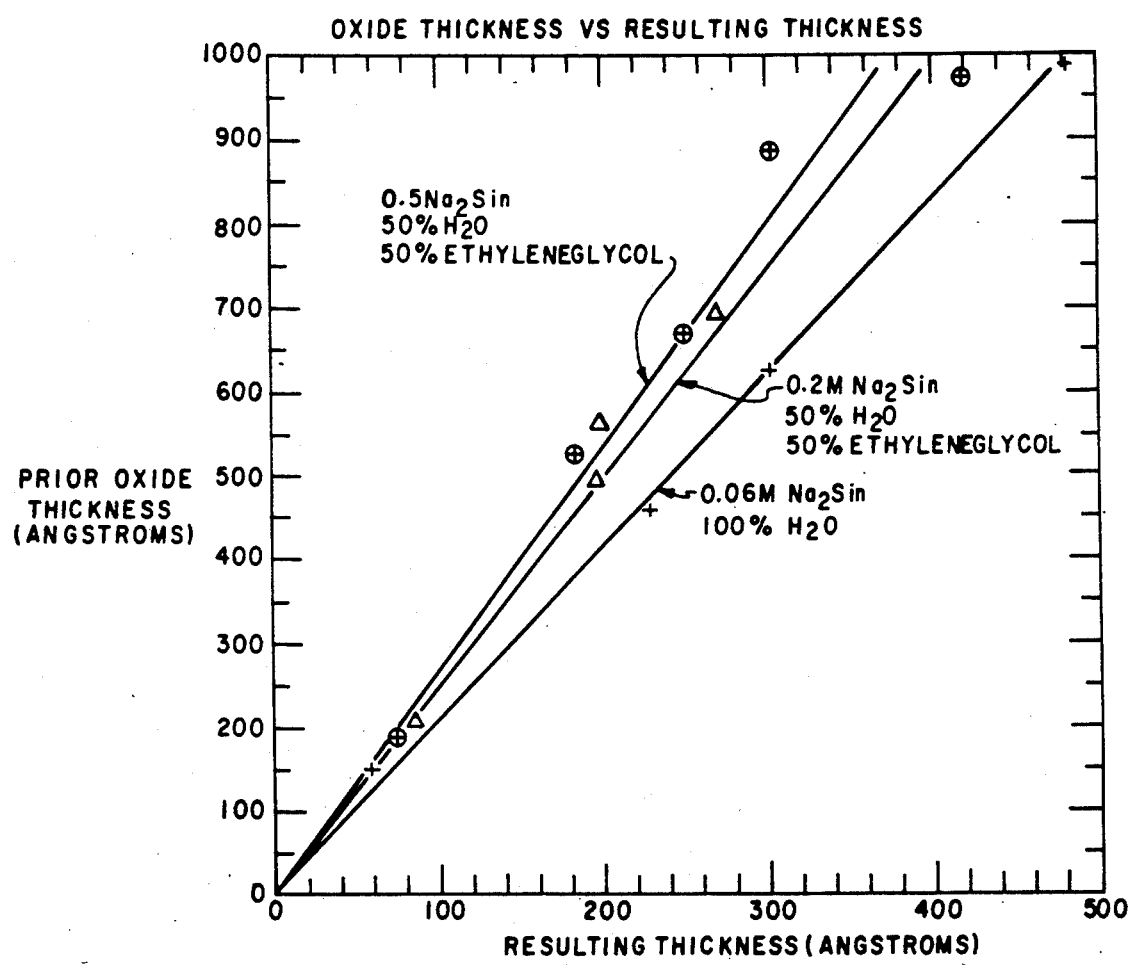
FIG. 3 illustrates the relation of the initial oxide thickness to the resultant sulfide thickness.

The resultant sulfide layer is primarily CdS with a small fraction of HgS as determined by surface analysis techniques; note that both HgS and $TeS_2$ form soluble complexes in the dip solution. The sulfide layer is uniform and less porous than the original oxide. FIG. 3 illustrates the resultant sulfide thickness for three different dip solutions: the ⊕ points are for 0.5M $Na_2S$ in 50% water and 50% ethylene glycol: the Δ points are for 0.2M $Na_2S$ in 50% water and 50% ethylene glycol: and the + points are for 0.06M $Na_2S$ in 100% water. Note the relative independence of the resultant sulfide thickness on the dip solution used. If the sulfide were to be directly grown by anodic sulfidization, nonuniformities of the layer are usually encountered, particularly around grain boundaries.

The second preferred embodiment method is analogous to the first preferred embodiment except the dip solution is 0.1M $Na_2Se$ plus 0.1M NaOH in 20% water and 80% ethylene glycol and the dip time is 15 minutes for converting a 600 Å thick layer of oxide to an about 200 Å thick layer of selenide. Also, the instability of the selenide ion in air requires use of apparatus such as glove bags under nitrogen atmosphere to exclude oxygen from contact with the selenide solution. The selenide conversion is much slower than the sulfide conversion due to kinetic limitations. Again, tellurium and mercury are to lost to the dip solution and the $Hg_{.5}Cd_{.2}TeO_{2.7}$ converts primarily to CdSe with some HgSe. As with sulfide, the concentration of selenide ions and organic solvents in the dip solution affects conversion time.

MODIFICATIONS AND ADVANTAGES

Various modifications of the preferred embodiment passivation methods and devices may be made while retaining the feature of chemically converting an oxide of $Hg_{1-x}Cd_xTe$ or similar materials such as $Hg_{1-x-y}Cd_xMn_yTe$ to a sulfide or selenide to form a passivating layer. For example, oxides on various size slices and ingots of $Hg_{1-x}Cd_xTe$ can be converted in various solutions with available sulfide or selenide ions, or even a solution with both sulfide and selenide ions such as 0.5M $Na_2Se$ plus 0.1M $Na_2S$ in 20% water and 80% ethylene glycol. And the oxides could be anodic, native, plasma grown, photochemically grown, or otherwise formed.

Further, the method could also be applied to thin films of $Hg_{1-x}Cd_xTe$ or similar materials such as LPE or VPE films on various substrates such as CdTe and CdMnTe, as well as other compound semiconductors. Such substrates with doped films and doped bulk $Hg_{1-x}Cd_xTe$ can be incorporated into various infrared detectors and arrays to provide the photosensitive semiconductor. Detectors employing photodiodes, CCDs, CIDs, as well as the CIM of FIG. 1B all can use the sulfide or selenide passivation.

The advantages of chemically converted oxide to sulfide or selenide passivation include the temperature stability, simplicity of the process, the uniformity and control of the final converted layer thickness, and the process compatibility with oxides grown by other than electrochemical techniques (for example, plasma oxides) which would permit high volume processing.

What is claimed is:

1. A method of passivating a $Hg_{1-x}Cd_xTe$ substrate, comprising the steps of:

(a) growing an oxide layer on said $Hg_{1-x}Cd_xTe$;
(b) chemically converting said layer from $Hg_{1-x}Cd_xTe$ oxide to a member of the group consisting of $Hg_{1-x}Cd_xTe$ sulfide, $Hg_{1-x}Cd_xTe$ selenide, and a combination of $Hg_{1-x}Cd_xTe$ sulfide and $Hg_{1-x}Cd_xTe$ selenide; and
(c) said oxide is anodically grown.

2. The method of claim 9, wherein:
(a) said converting is by immersion in a solution of a member of the group consisting of sulfide ions, selenide ions, and a combination of sulfide and selenide ions.

3. The method of claim 2, wherein:
(a) said solution includes water.

4. The method of claim 2, wherein:
(a) said solution includes ethylene glycol.

5. The method of claim 2, wherein:
(a) said ions are provided by a member of the group consisting of alkali sulfides, alkali selenides, and a combination of alkali sulfides and selenides.

6. A method of passivating a semiconductor region on a substrate comprising the steps of:
(a) growing an oxide layer on said semiconductor;
(b) immersing said oxide layer in a solution of a member of the group consisting of sulfide ions, selenide ions, and a combination of sulfide ions and selenide ions, whereby said oxide layer converts to a sulfide or selenide or combination layer.
(c) said oxide growing is anodic growing.

7. The method of claim 6, wherein:
(a) said semiconductor is $Hg_{1-x}Cd_xTe$.

8. The method of claim 6, wherein:
(a) said solution includes ethylene glycol.

9. The method of claim 6, wherein:
(a) said solution includes water.

10. The method of claim 6, wherein:
(a) said ions are provided by a member of the group consisting of alkali sulfides, alkali selenides, and a combination of alkali sulfides and selenides.

11. The method of claim 9, wherein:
(a) said solution includes an alkali hydroxide.

* * * * *